United States Patent
Haridass et al.

(10) Patent No.: US 7,266,788 B2
(45) Date of Patent: Sep. 4, 2007

(54) VIA/BSM PATTERN OPTIMIZATION TO REDUCE DC GRADIENTS AND PIN CURRENT DENSITY ON SINGLE AND MULTI-CHIP MODULES

(75) Inventors: Anand Haridass, Austin, TX (US);
Andreas Huber, Austin, TX (US);
Erich Klink, Schoenaich (DE);
Thomas Strach, Wildberg (DE);
Jochen Supper, Herrenberg (DE)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 11/184,350

(22) Filed: Jul. 19, 2005

(65) Prior Publication Data

US 2007/0022398 A1 Jan. 25, 2007

(51) Int. Cl.
*G06F 17/50* (2006.01)

(52) U.S. Cl. .............................. 716/1; 716/8

(58) Field of Classification Search ............. 716/1, 716/2, 6, 7, 8, 9, 10
See application file for complete search history.

(56) References Cited

U.S. PATENT DOCUMENTS

| 6,462,976 | B1* | 10/2002 | Olejniczak et al. ......... 363/147 |
| 6,806,563 | B2* | 10/2004 | Libous et al. ............... 257/691 |
| 6,971,160 | B1* | 12/2005 | Welch et al. ................. 29/832 |
| 2004/0183184 | A1* | 9/2004 | Libous et al. ............... 257/690 |
| 2006/0059373 | A1* | 3/2006 | Fayad et al. ................ 713/192 |

* cited by examiner

*Primary Examiner*—Sun James Lin
(74) *Attorney, Agent, or Firm*—Casimer K Sadys; Jack V. Musgrove

(57) ABSTRACT

A carrier for an electronic device such as an integrated circuit chip is designed by assigning two different voltage domains to two separate areas of the contact surface of the carrier, while providing a common electrical ground for both voltage domains. The integrated circuit chip may be a microprocessor having a nominal operating voltage, and the different voltages of the two voltage domains are both within the tolerance range of the nominal operating voltage but one of the voltage domains is aligned with a high power density area of the microprocessor (e.g., the microprocessor core) and provides a slightly greater voltage. The higher power voltage domain preferably has a ratio of voltage pins to ground pins that is greater than one.

18 Claims, 2 Drawing Sheets

VIA/BSM PATTERN OPTIMIZATION TO REDUCE DC GRADIENTS AND PIN CURRENT DENSITY ON SINGLE AND MULTI-CHIP MODULES

BACKGROUND OF THE INVENTION

1. Field of the Invention

The present invention generally relates to the design of integrated circuits and packaging for semiconductor chips, and more particularly to a method of assigning voltage domains (power and ground) to contacts of a chip carrier or interconnect.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

As the size of integrated circuits continues to shrink, and pin densities grow, it becomes increasingly more difficult to interconnect the chip to external circuitry. Chips are commonly attached to a substrate, e.g., a printed circuit board (PCB) using a carrier or package which fans out the connections to pads or pins on the PCB. FIG. 1 illustrates a typical chip assembly which includes an IC chip 1, a package 2, a PCB 3, and miscellaneous components such as capacitors 4. These various elements may be electrically coupled using surface-mount connections with C4 solder ball arrays 5. IC chip 1 is connected to package 2 which is in turn connected to PCB 3. Package 2 and PCB 3 both have multiple horizontal layers interconnected by vertical vias. A single layer may contain multiple planes, i.e., some for wiring and others for an electrical ground plane or a power plane. A given plane in package 2 may have multiple connections to the top and bottom surfaces to couple ground or power planes of IC chip 1 to ground or power planes of PCB 3. It is common to find 24 or more levels of wiring within a package.

The package itself can significantly affect the performance of the integrated circuit it supports, particularly as power supply currents, power densities, and operating frequencies increase. In addition to shrinking feature sizes and advances in lithography in CMOS technology that have increased circuit integration density (and thereby power density), there has also been a reduction in the chip's operating nominal voltage. These factors have progressively made it more difficult to deliver clean and controlled power to IC chips, and power delivery is often the most critical parameter in a system design. Decreasing channel widths are further leading to an exponential increase is leakage currents.

To more efficiently optimize leakage and power consumption on the chip, some chips are being partitioned into multiple voltage domains. However, partitioning in this manner requires the different voltages to be controlled very tightly which results in major constraints on the chip carrier design. The parameters of concern include the voltage gradients available at the circuits across the chip and pin current magnitudes at the carrier/PCB interface, all of which should ideally be minimized. Optimization is even more difficult with complex circuits like microprocessor chips that integrate one or more CPU (central processing unit) cores, input/output (I/O) interfaces, memory control units and several other functional units into one chip. Each of these building blocks are designed to meet their performance targets and are built with appropriate transistor types and circuit densities which causes a high power density variation across the chip area. In particular, the cores (which have a very high circuit density) typically have a much higher power demand compared to the rest of the functional units and are more sensitive to DC-drop (gradient) and current density.

Unfortunately, state-of-the-art chip carrier designs for single or multi-chip modules (SCM/MCM) are typically designed using a homogenous pattern for the bottom-side metallization (BSM) pins with no consideration given to circuit or power densities. When calculating the required power vias/pins for each voltage domain, the projected total current is simply divided by the maximum allowed pin/via current; the chip power density floorplan is not taken into account. As a result, the expected maximum pin current is higher than the calculated average current by a factor of 3-4. It would, therefore, be desirable to devise an improved technique for delivering power to an integrated circuit chip which could reduce DC gradients across the chip and power dissipation on the chip carrier. It would be further advantageous if the technique could reduce the maximum pin currents at the carrier/PCB interface.

SUMMARY OF THE INVENTION

It is therefore one object of the present invention to provide an improved method of designing a carrier for an integrated circuit chip.

It is another object of the present invention to provide a chip carrier whose power contacts (voltage/ground) are arranged to more efficiently deliver power to different voltage domains of a chip.

It is yet another object of the present invention to provide a chip carrier having power interconnections designed to reduce DC gradients across the chip.

The foregoing objects are achieved in a method of designing a carrier for an electronic device such as an integrated circuit chip, by defining two separate areas of the contact surface of the carrier and assigning different voltage domains to the two areas while providing a common electrical ground for both voltage domains. In an exemplary implementation, the integrated circuit chip is a microprocessor having a nominal operating voltage, and the different voltages of the voltage domains are both within the tolerance range of the nominal operating voltage, but one of the voltage domains is aligned with a high power density area of the microprocessor (e.g., the microprocessor core) and provides a slightly greater voltage. That voltage domain preferably has a ratio of voltage pins to ground pins that is greater than one. The contact surface may be a bottom-side metallization (BSM) of the carrier, and the pins on the BSM are interconnected with pins on the top-side metallization (TSM) using vias that extend through the thickness of the carrier. The pins of the top-side metallization are adapted to interconnect with contacts of a printed circuit board.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
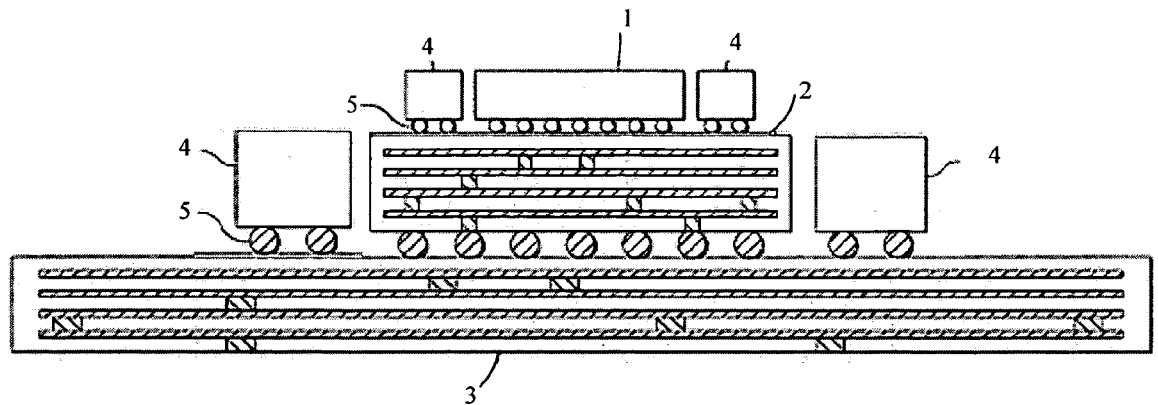
FIG. 1 is a side elevational view of a conventional integrated circuit (IC) chip assembly wherein an IC package interconnects an IC chip to a printed circuit board, with the IC package and printed circuit board shown in cross-section.
Figure 2:
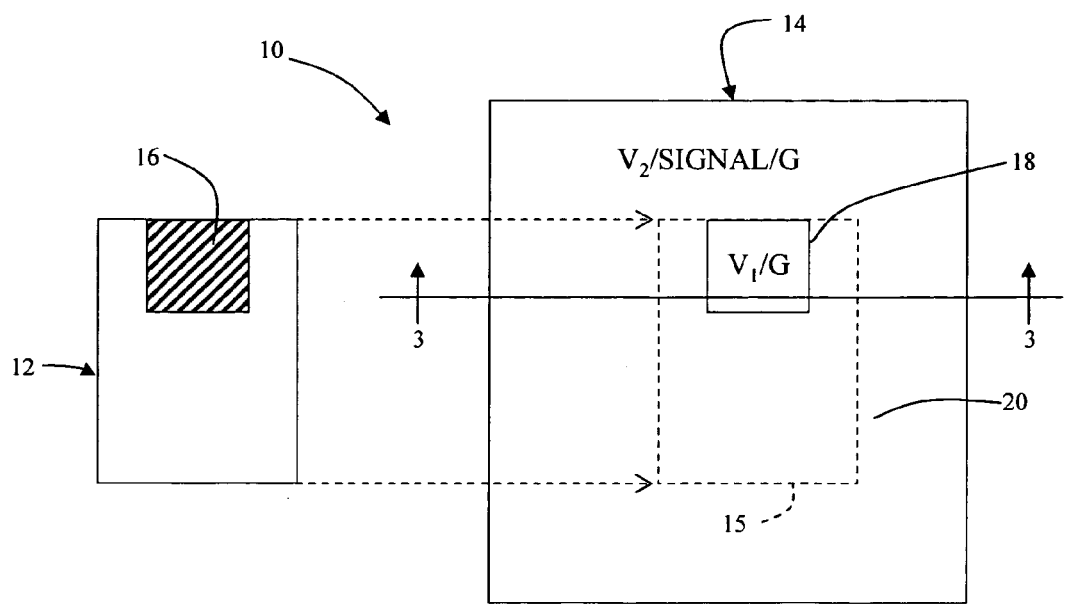
FIG. 2 is a plan view of one embodiment of a chip assembly constructed in accordance with the present invention, illustrating placement of an IC chip on a chip carrier having a different voltage domain area aligned with a high circuit density area of the chip.

With reference now to the figures, and in particular with reference to FIG. 2, there is depicted one embodiment 10 of a chip assembly constructed in accordance with the present invention. Chip assembly 10 is generally comprised of an integrated circuit (IC) chip 12 and a chip carrier 14. Chip 12 may be for example a microprocessor having a core 16. Chip 12 is supported by chip carrier 14 as indicated by the dashed rectangle 15 which represents the shadow or footprint of chip 12. The mounting surface of chip carrier 14 has a multitude of contacts or pins which interconnect with pins of chip 12 using solder ball arrays. Chip assembly 10 may include additional interconnection levels, such as a printed circuit board (PCB) which is connected to the other side of chip carrier 14.

Core 16 of microprocessor 12 is a relatively high power density area, that is, it has a much higher power demand compared to the rest of the functional units of the microprocessor. Core 16 may also be more sensitive to voltage gradients and current density. Chip carrier 14 is designed to complement the layout of core 16 within microprocessor 12 by dividing the contact surface of carrier 14 into at least two separate areas having different voltage domains, i.e., wherein two voltages are independently provided. In this example, one of the voltage domains 18 provides a first voltage $V_1$, and this voltage domain 18 generally coincides with the superposed area of core 16 when chip 12 is mounted on carrier 14. In other words, the chip carrier surface area that is aligned with core 16 is totally assigned to the first voltage domain. The remainder of the contact surface of carrier 14 is in the other voltage domain 20 which provides a second voltage $V_2$ to the rest of the power connections for chip 12. The second power domain 20 may also include signal vias/pins, but in this embodiment no signal vias/pins are defined in the first voltage domain 18. Each of the voltage domains 18, 20 share a common ground plane (segmented) within carrier 14. While FIG. 2 depicts the second voltage domain as extending across the entire contact surface of carrier 14 (except for the core voltage domain), it need not be so expansive, as pins outside the chip shadow do not contribute much to power distribution.

For a microprocessor application, the nominal operating voltage of the chip might be in the range of 0.8-1.2 volts, in which case the voltage domains of carrier 14 may be adapted to provide voltages of $V_1$=1.10 volts and $V_2$=1.09 volts. Thus, in this example the smaller area voltage domain is designated for the greater of the two voltages to service the higher power density area of the chip and, even though the two voltages are slightly different, they are still within the tolerance range of the same nominal voltage.

Figure 3:
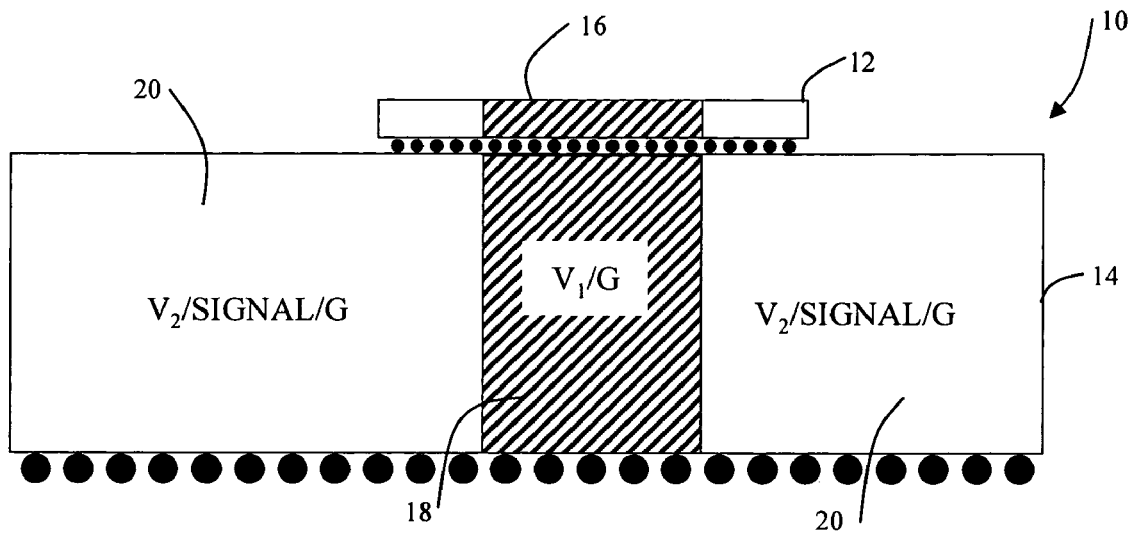
FIG. 3 is an elevational cross-section taken along lines 3-3 of FIG. 2.

FIG. 3 is a sectional view of chip assembly 10 taken along lines 3-3 of FIG. 2, and further illustrates the alignment of pins of carrier 14 for the first voltage domain 18 with pins of core 16, as well as the alignment of vias extending through the thickness of carrier 14. First voltage domain 18 is surrounded by second voltage domain 20. This example only uses two voltage domains, but additional voltage domains can be provided according to the voltage/power requirements of the particular application. Also, the different voltage domain areas in this example are adjacent, but the invention could be implemented as well with non-contiguous areas.

The present invention accordingly describes a design technique to achieve a stable on-chip power supply across the chip and to reduce the maximum pin currents. A reduction of the power dissipated on the chip carrier itself is also achieved, which reduces the total power the regulator of the overall system needs to deliver. By increasing the power under the high power density areas of the chip, and since the ground is common between the different voltage domains, the ground voltage gradient and pin currents are lower than that seen by the high power voltage domain.

Figure 4:
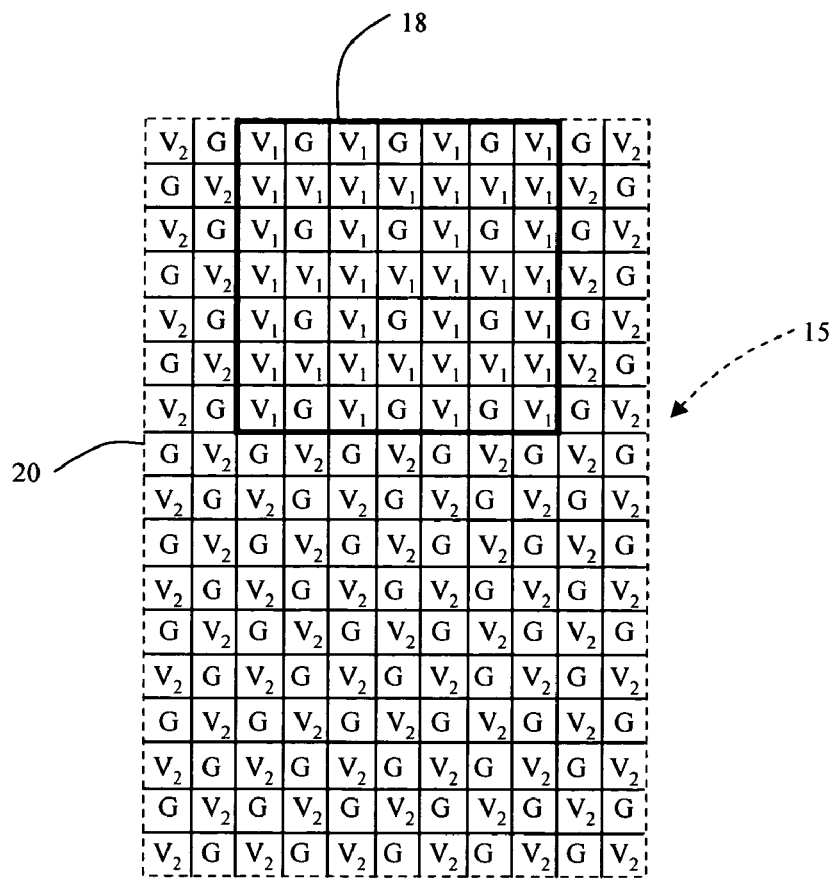
FIG. 4 is a plan view of a pin pattern for a contact surface of the chip carrier of FIG. 2, depicting one implementation of the different voltage domain wherein the ratio of voltage pins to ground pins in this area is greater than one.

The power pin assignments in the high power density area can be further optimized by making the ratio of the $V_1$/Ground pins greater than one. Pin assignments for an exemplary implementation are shown in FIG. 4 which represents the bottom-side metallization (BSM) or contact surface of carrier 14 within the footprint 15 of chip 12. Each square in FIG. 4 represents a pin assignment, either $V_1$, $V_2$ or ground (G), which interconnects with a respective power supply or return pin of IC chip 12. The first voltage domain 18 is defined under the high power density area of chip 12, i.e., core 16, with only $V_1$ and ground pins from the top-side metallizaion (TSM) to the BSM to reduce or minimize DC drop and gradient. The BSM pattern in first voltage domain 18 is a 7×7 pin array, with some rows and columns having alternating $V_1$ and ground pins while some rows and columns have only $V_1$ pins. In the depicted example the ratio of voltage pins to ground pins in first voltage domain 18 is 37:12. The ground via/pin assignments not only reduce the maximum pin currents but also ensure adequate $V_1$ power supply impedance (reducing inductive loops). The second voltage (lower power density) domain 20 is assigned to the rest of the chip and BSM pins in an alternating voltage/ground pattern (within the shadow 15 of chip 12) or voltage/signal/ground pattern (outside of the shadow 15 of chip 12).

This second voltage may be used for the input/output (I/O) power domain in which case these assignments ensure a good signal return path.

The size of chip assembly 10 may vary considerably depending upon the particular application. In an exemplary embodiment, carrier 14 is adapted to interconnect a chip 12 whose surface area is approximately 10 mm×10 mm, with a core footprint size of about 5 mm×5 mm. The carrier thickness is about 2 mm. The pin spacing on the BSM is approximately 1 mm, and the pin spacing on the TSM is approximately 0.2 mm.

The foregoing design principle can be applied for different chip carrier substrates, e.g., multilayer ceramic, multilayer glass ceramic, and organic (polymeric) chip carriers with or without build-up layers. In each of these cases, the present invention provides a significant reduction of the DC gradient across the chip and power dissipation on the chip carrier, and further reduces the maximum pin currents at the carrier/PCB interface.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention is described in the context of a microprocessor chip having a single core, but the invention could be implented as well in a microprocessor having two or more cores, in which case the higher voltage domain would comprise multiple areas, underlying each of the cores. It is therefore contemplated that such modifications can be made without departing from the spirit or scope of the present invention as defined in the appended claims.

What is claimed is:

1. A method of constructing a carrier for an electronic device, comprising:
   defining a first area of a contact surface of the carrier;
   defining a second area of the contact surface separate from the first area;
   assigning a first voltage domain to the first area of the contact surface, adapted to provide a first voltage to the electronic device;
   assigning a second voltage domain to the second area of the contact surface, adapted to provide a second voltage which is different from the first voltage to the electronic device; and
   providing a common electrical ground for return currents from both the first voltage domain and the second voltage domain.

2. The method of claim 1 wherein:
   the electronic device has a nominal operating voltage; and
   the first voltage and the second voltages are both within a tolerance range of the nominal operating voltage.

3. The method of claim 1 wherein the first area of the contact surface has a plurality of voltage pins and a plurality of ground pins, and a ratio of the voltage pins to the ground pins is greater than one.

4. The method of claim 1 wherein the contact surface is a bottom-side metallization, and further comprising:
   interconnecting pins of the first voltage domain and the second voltage domain with pins of a top-side metallization using vias that extend through a thickness of the carrier, the pins of the top-side metallization being adapted to interconnect with contacts of a printed circuit board.

5. The method of claim 1 wherein:
   the first voltage is greater than the second voltage; and
   the first area is aligned with a footprint of a high power density area of the electronic device.

6. The method of claim 5 wherein the first area is smaller than the second area.

7. A carrier for an integrated circuit chip comprising:
   a substrate having a contact surface with a plurality of pins on the contact surface, said pins arranged in at least a first area and a second area wherein the first area and the second area have common ground contacts, the first area has first voltage contacts for a first voltage domain, and the second area has second voltage contacts for a second voltage domain.

8. The carrier of claim 7 wherein:
   the integrated circuit chip has a nominal operating voltage;
   the first voltage domain has a first voltage within a tolerance range of the nominal operating voltage; and
   the second voltage domain has a second voltage within the tolerance range of the nominal operating voltage.

9. The carrier of claim 7 wherein the first area of said contact surface has a plurality of voltage pins and a plurality of ground pins, and a ratio of said voltage pins to said ground pins is greater than one.

10. The carrier of claim 7 wherein said contact surface is a bottom-side metallization, and said substrate further has vias that extend through a thickness of said substrate to interconnect pins of the first voltage domain and the second voltage domain with pins of a top-side metallization, said pins of said top-side metallization being adapted to interconnect with contacts of a printed circuit board.

11. The carrier of claim 7 wherein:
   the first voltage domain has a first voltage which is greater than a second voltage of the second voltage domain; and
   the first area is aligned with a footprint of a high power density area of the integrated circuit chip.

12. The carrier of claim 11 wherein the first area is smaller than the second area.

13. A chip assembly comprising:
   an integrated circuit chip having a high power density area with a plurality of first power supply pins and a plurality of first return pins, and a low power density area with a plurality of second power supply pins and a plurality of second return pins; and
   a carrier having a contact surface, said contact surface having a first area with a plurality of first voltage pins and a plurality of first ground pins, and having a second area with a plurality of second voltage pins and a plurality of second ground pins, wherein:
   the first area is aligned with the high power density area,
   the second area is aligned with the low power density area,
   said first power supply pins are respectively connected to said first voltage pins,
   said second power supply pins are respectively connected to said second voltage pins,
   said first return pins are respectively connected to said first ground pins,
   said second return pins are respectively connected to said second ground pins,
   said first voltage pins are adapted to provide a first voltage, said second voltage pins are adapted to provide a second voltage which is different from the first voltage, and said first ground pins and said second ground pins are connected to a common ground plane of said carrier.

14. The chip assembly of claim 13 wherein:

said integrated circuit chip has a nominal operating voltage;

the first voltage is within a tolerance range of the nominal operating voltage; and the second voltage is within the tolerance range of the nominal operating voltage.

15. The chip assembly of claim 13 wherein a ratio of said first voltage pins to said first ground pins is greater than one.

16. The chip assembly of claim 13 wherein said contact surface is a bottom-side metallization, and said carrier further has vias that extend through a thickness of said carrier to interconnect said first voltage pins and said second voltage pins with respective pins of a top-side metallization, said pins of said top-side metallization being adapted to interconnect with contacts of a printed circuit board.

17. The chip assembly of claim 13 wherein the first voltage is greater than the second voltage.

18. The chip assembly of claim 17 wherein the first area is smaller than the second area.

* * * * *